United States Patent [19]

Kinouchi et al.

[11] Patent Number: 5,736,945
[45] Date of Patent: Apr. 7, 1998

[54] CIRCUIT FOR ZERO-RUN DEVELOPING RUN/LEVEL SETS AND METHOD FOR ZERO-RUN DEVELOPING THE SAME

[75] Inventors: Shigenori Kinouchi; Akira Sawada. both of Tokyo, Japan

[73] Assignee: NEC Corporation, Japan

[21] Appl. No.: 604,430

[22] Filed: Feb. 21, 1996

[30] Foreign Application Priority Data

Feb. 21, 1995 [JP] Japan ................................ 7-032488

[51] Int. Cl.[6] .................................................. H04N 11/04
[52] U.S. Cl. ......................................... 341/63; 341/50
[58] Field of Search .............................. 341/63, 76, 50

[56] References Cited

U.S. PATENT DOCUMENTS 5,363,097  11/1994  Jan ......................................... 341/67
5,369,045  11/1994  Choi et al. ............................. 341/63
5,369,405  11/1994  Choi et al. ............................. 341/63

FOREIGN PATENT DOCUMENTS 4200173  7/1992  Japan.

*Primary Examiner*—Jeffrey A. Gaffin
*Assistant Examiner*—Peguy JeanPierre
*Attorney, Agent, or Firm*—Ostrolenk, Faber, Gerb & Soffen

[57] ABSTRACT

A zero-run developing circuit for performing a zero-run developing process for placing zeros represented by a run between first non-zero data and second non-zero data of a block of a predetermined number of run-length signals, each of which is composed of the level of the value of non-zero data and the run that is the number of zero-data followed by the non-zero data is disclosed, that comprises a latch circuit for latching the levels of the predetermined number of the non-zero data, a first write position generating circuit for generating a first latch position of the latch circuit at which the first non-zero data is written corresponding to a first run length signal, and a second write position generating circuit for generating a second latch position of the latch circuit at which the second non-zero data is written corresponding to the first run-length signal and a second run-length signal.

7 Claims, 3 Drawing Sheets

FIG.3

| ADDRESS (DECIMAL NOTATION) | DATA (DECIMAL NOTATION) | LATCH | ADDRESS (DECIMAL NOTATION) | DATA (DECIMAL NOTATION) | LATCH |
|---|---|---|---|---|---|
| 0 | 100 | L1 | 32 | 0 | L33 |
| 1 | 5 | L2 | 33 | 0 | L34 |
| 2 | 0 | L3 | 34 | 0 | L35 |
| 3 | 0 | L4 | 35 | 0 | L36 |
| 4 | 3 | L5 | 36 | 0 | L37 |
| 5 | 0 | L6 | 37 | 0 | L38 |
| 6 | 1 | L7 | 38 | 0 | L39 |
| 7 | 0 | L8 | 39 | 0 | L40 |
| 8 | 0 | L9 | 40 | 0 | L41 |
| 9 | 0 | L10 | 41 | 0 | L42 |
| 10 | 0 | L11 | 42 | 0 | L43 |
| 11 | 0 | L12 | 43 | 0 | L44 |
| 12 | 0 | L13 | 44 | 0 | L45 |
| 13 | 0 | L14 | 45 | 0 | L46 |
| 14 | 0 | L15 | 46 | 0 | L47 |
| 15 | 0 | L16 | 47 | 0 | L48 |
| 16 | 0 | L17 | 48 | 0 | L49 |
| 17 | 0 | L18 | 49 | 0 | L50 |
| 18 | 0 | L19 | 50 | 0 | L51 |
| 19 | 0 | L20 | 51 | 0 | L52 |
| 20 | 0 | L21 | 52 | 0 | L53 |
| 21 | 0 | L22 | 53 | 0 | L54 |
| 22 | 0 | L23 | 54 | 0 | L55 |
| 23 | 0 | L24 | 55 | 0 | L56 |
| 24 | 0 | L25 | 56 | 0 | L57 |
| 25 | 0 | L26 | 57 | 0 | L58 |
| 26 | 0 | L27 | 58 | 0 | L59 |
| 27 | 0 | L28 | 59 | 0 | L60 |
| 28 | 0 | L29 | 60 | 0 | L61 |
| 29 | 0 | L30 | 61 | 0 | L62 |
| 30 | 0 | L31 | 62 | 0 | L63 |
| 31 | 0 | L32 | 63 | 0 | L64 |

CIRCUIT FOR ZERO-RUN DEVELOPING RUN/LEVEL SETS AND METHOD FOR ZERO-RUN DEVELOPING THE SAME

FIELD OF THE INVENTION

The present invention relates to a circuit and a method for zero-run developing RUN/LEVEL sets, in particular, to a circuit and a method for zero-run developing RUN/LEVEL sets that are output data of a decoding process of Huffman code for use in a moving picture compressing/expanding technology such as MPEG standard.

BACKGROUND OF THE INVENTION

Since the data amount of picture data is huge, when it is transmitted or recorded, it should be compressed. Thus, when the picture data is received or reproduced, it should be expanded. Conventionally, means for effectively compressing and expanding huge amount of picture data was expensive. Thus, the compressing/expanding technologies were mainly used for dedicated large apparatuses such as television conference apparatuses. However, recently, due to improvement of compressing/expanding technologies and advancement of semiconductor technologies, picture compressing/expanding apparatuses composed of a small number of LSI devices that are inexpensive have been commercially available.

The moving picture compressing/expanding method is also referred to as picture encoding/decoding method. The moving picture compressing/expanding method has been internationally standardized. As an international standard, MPEG1 (hereinafter referred to as MPEG) standard was recommended by working groups (ISO/IEC, JTC1/SC2/WG2, Moving Picture Expert Group: MPEG) of ISO and CCITT in 1993 as recommendation ISO/IEC-11172-2 for a moving picture encoding/decoding method for picture data recorded on a storage medium.

Conventionally, in a moving picture encoding/decoding apparatus according to the MPEG standard or the like, input picture data is transformed into DCT data (Discrete Cosine Transformed data). The DCT data is quantized (divided) corresponding to a quantizing table. The quantized DCT data is one-dimensionally arrayed by a zigzag scanning method or the like. The resultant data is zero-run processed and Huffman encoded. Most of the quantized DCT data are zero-data except for a DC component and low frequency components. Now, it is defined that the value of non-zero quantized data is referred to as LEVEL and the number of zero-data that precedes the non-zero quantized data is referred to as RUN. When the Huffman code is decoded, by zero-run developing RUN/LENGTH sets of the output data of the decoding process, the original quantized DCT data is restored.

Conventionally, when the zero-run developing process is performed, the memory was accessed for each RUN/LEVEL set.

In the conventional zero-run developing circuit, LEVEL data is stored in the memory at an address determined by RUN data and the end of black signal (EOB signal) for each RUN/LEVEL set.

In the above-described zero-run developing circuit, however, there is a disadvantage in that, since data is directly written and read to/from the memory, RUN/LEVEL sets should be processed one by one, so that the zero-run developing process requires a long time.

SUMMARY OF THE INVENTION

It is an object of the present invention to provide a zero-run developing circuit and a zero-run developing method for processing RUN/LEVEL sets in parallel, thereby reducing the processing time.

According to the present invention, a zero-run developing circuit for performing a zero-run developing process for placing zeros represented by a run between first non-zero data and second non-zero data of a block of a predetermined number of run-length signals, each of which is composed of the level of the value of non-zero data and the run that is the number of zero-data followed by the non-zero data, comprises a latch circuit for latching the levels of the predetermined number of the non-zero data, a first write position generating circuit for generating a first latch position of the latch circuit at which the first non-zero data is written corresponding to a first run length signal, and a second write position generating circuit for generating a second latch position of the latch circuit at which the second non-zero data is written corresponding to the first run-length signal and a second run-length signal. Since the zero-run developing circuit according to the present invention comprises a plurality of latch means corresponding to the number of block data and first and second write position generating means for writing first and second non-zero data to the latch means corresponding to first and second run-length signals, the circuit can process at least two sets of RUN/LEVEL at a time, thereby reducing the process time by ½ or less.

These and other objects, features and advantages of the present invention will become more apparent in light of the following detailed description of a best mode embodiment thereof, as illustrated in the accompanying drawings.

BRIEF DESCRIPTION OF THE DRAWINGS

FIG. 3 is a diagram showing th the relation of address, data and latch in the preferred embodiment.

DESCRIPTION OF THE PREFERRED EMBODIMENT

Before describing a zero-run developing circuit in the preferred embodiment of the present invention, the aforementioned conventional zero-run developing circuit will be explained in FIG. 1.

Figure 1:
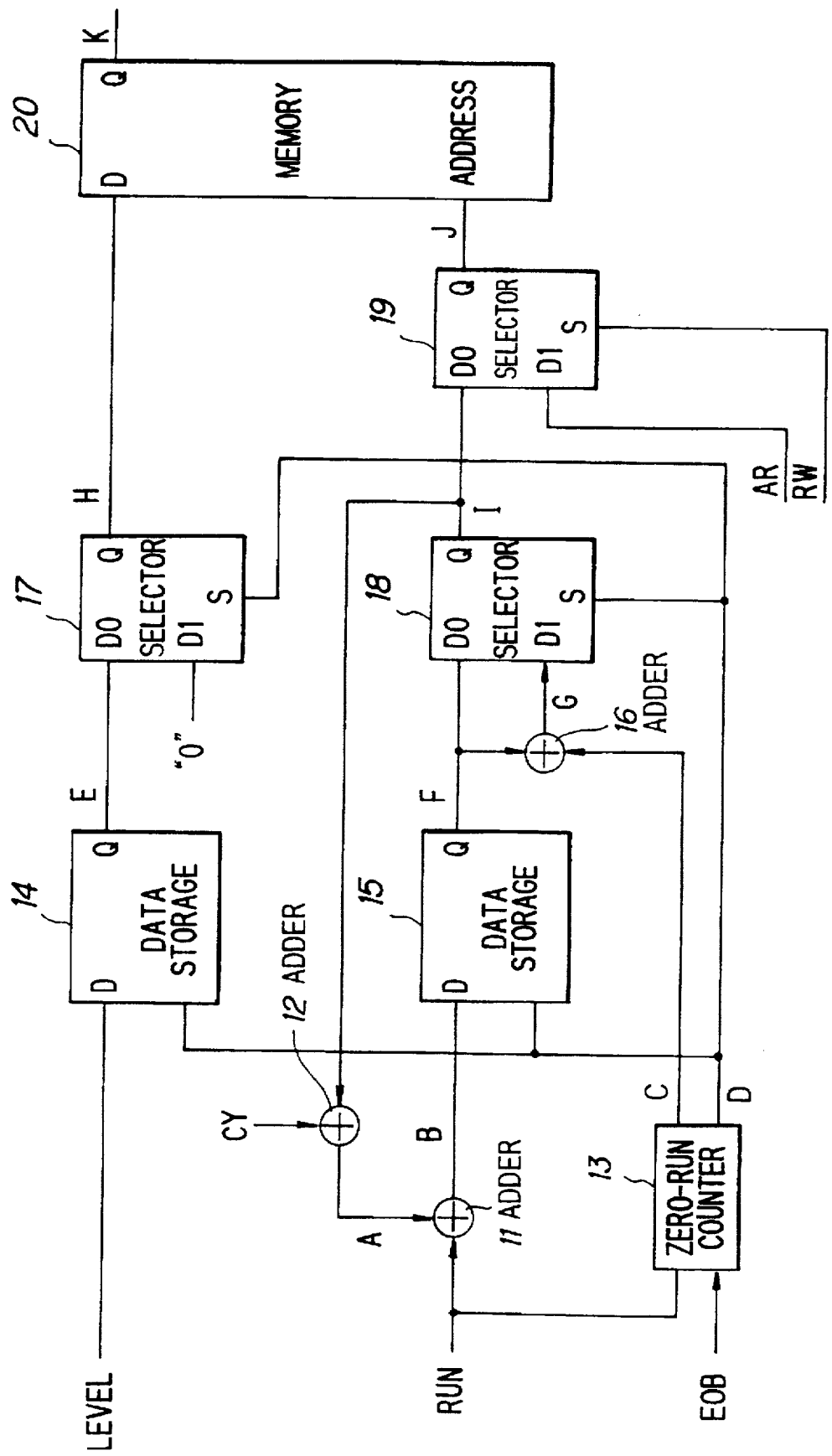
FIG. 1 is a block diagram showing an example of a conventional zero-run developing circuit.

FIG. 1 is a block diagram showing a conventional zero-run developing circuit. The zero-run developing circuit comprises an adder 11, an adder 12, a zero-run counter 13, data storage portions 14 and 15, an adder 16, a selector 17, a selector 18, a selector 19, and a memory 20. The adder 11 adds an input RUN and output data A of the adder 12. The adder 12 adds a signal I and a signal CY. The zero-run counter 13 counts up corresponding to RUN or EOB (End Of Block) and outputs count data C. In addition, while the zero-run counter 13 is counting up, it outputs a storage signal D. The data storage portions 14 and 15 store LEVEL data and RUN data and Output data E and data F, respectively. The adder 16 adds the data E and the count data C and outputs data G. The selector 17 selects the data E or data "0" corresponding to the storage signal D as a select signal and outputs data H. The selector 18 selects the data F or the data G and outputs data I. The selector 19 selects a read/write address AR of the memory 20 and outputs data J. The memory 20 inputs the data H as input data. In addition, the memory 20 inputs the data J as an input address.

Next, with reference to FIG. 1, the operation of the conventional zero-run developing circuit will be described. One block is composed of 64 (8 (columns)×8 (rows)) pixel data. In the MPEG standard or the like, when the end of the block is a RUN, an EOB code is placed along with RUN/LEVEL sets. In addition, when there is no zero-data in 64 data (in other words, all LEVELs 0 and all RUNs=0), there are 64 RUN/LEVEL sets. The selectors 17 to 19 select D1 and D0 when their select signals are "1" and "0", respectively. When an RUN 0 is input, the zero-run counter 13 counts up for the value corresponding to the value of the RUN and outputs the count data C. When the zero-run counter 13 outputs the count signal C to the data storage portions 14 and 15, the data storage signal D becomes "1", causing the data storage portions 14 and 15 to store data. When the zero-run counter 13 stops outputting the count signal C to the data storage portions 14 and 15, the storage signal D becomes "0", causing the data storage portions 14 and 15 not to store data. When a RUN=2 is input, the zero-run counter 13 counts up from "1" to "2" When a RUN=3 is input, the zero-run counter 13 counts up from "1" to "3". When an EOB is input, until 64 data are written to the memory 20, the zero-run counter 13 outputs data from "1" to "63" as the count data C. At this point, the storage signal is "0". In the read state of the memory 20, the read/write signal for the memory 20 is "1". In the write state of the memory 20, the read/write signal for the memory 20 is "0".

When 64 data of one block are written to the memory 20, the contents of the data storage portions 14 and 15, the adders 11, 12 and 16, and the zero-run counter 13 are cleared. Next, assume that decimal data is written to the memory 20. For example, first to fourth RUN/LEVEL sets (0/100, 0/5, 2/3, and 1/1) are input. Thereafter, an EOB is input. At first, the first RUN/LEVEL set=0/100 is input. The RUN=0 is sent to the adder 11 and the zero-run counter 13. The LEVEL=100 is sent to the data storage portion 14. When the RUN=0 is sent, the adder 11 adds 0 and 0 (the previous data A and 0 because of clearing of the block). The resultant data B "0" is sent to the data storage portion 15. The zero-run counter 13 outputs the storage signal "0" corresponding to the RUN=0. The data storage portions 14 and 15 do not store the input data, but directly output the data E and the data F, respectively. The LEVEL data E "100" is sent to the selector 17. At this point, since the storage signal D "0" is sent as the select signal, the data "100" that is sent to the terminal D0 of the selector 17 is selected as the output data H and sent to the memory 20. On the other hand, the RUN data F "0" is sent to the selector 18 and the adder 16. Since the selector 18 receives the storage signal D "0" as the select signal, the selector 18 selects the data "0" as the output data I. The selector 18 sends the output data I to the selector 19 and the adder 12. The selector 19 sends the data I "0" as an address J to the memory 20 corresponding to "0" for the write mode of the select signal RW. The adder 12 adds 0 and 1 (CY) and sends the resultant data A "1" to the adder 11. Thus, the data "100" is written to the address "0" of the memory 20.

Thereafter, the RUN/LEVEL=0/5 set is input. Likewise, the adder 11 adds 0 and 1 and sends the output data B "1" to the data storage portion 15. The zero-run counter 13 outputs the storage signal D "0" corresponding to the RUN=0. The data storage portions 14 and 15 do not store the input data, but directly output the data E and the data F, respectively. The LEVEL data E "5" is sent to the selector 17. The selector 17 selects the data "5" corresponding to the select input data of the storage signal D "0" and sends the data "5" to the memory 20. On the other hand, the RUN data F "1" is sent to the selector 18 and the adder 16. The selector 18 selects the data F "1" corresponding to the storage/select signal D "0" and sends the data F "1" to the selector 19 and the adder 12.

The selector 19 sends the data J "1" to the memory 20 corresponding to the select signal RW "0". The adder 12 adds 1 B and 1 (CY) and sends the resultant data A "2" to the adder 11. Thus, the data "5" is written to the address "1" of the memory 20.

Thereafter, the RUN/LEVEL=2/3 set is input. Likewise, the adder 11 adds 2 and 2 and sends the output data B "4" to the data storage portion 15. The zero-run counter 13 outputs the storage signal D "1" corresponding to the RUN=2. The data storage portions 14 and 15 store input data and outputs previous data "5" and "1" as the data E and F, respectively. The LEVEL data E "5" is sent to the selector 17. The selector 17 selects the data "0" of the terminal D1 corresponding to the select input data of the storage signal D "1" and sends the data "0" as the data H to the memory 20. On the other hand, the RUN data F "1" is sent to the selector 18 and the adder 16. In addition, since the non-zero data "2" is sent to the zero-run counter 13, the zero-run counter 13 outputs the count data C "1" and "2". The data "1" is sent to the adder 16. The adder 16 adds 1 and 1 and sends the resultant data G "2" to the selector 18. The selector 18 selects the data G "2" of the terminal D1 corresponding to the storage/select signal D "1" and sends the data G "2" to the selector 19 and the adder 12. The selector 19 sends the data J "2" to the memory 20 corresponding to the select signal RW "0".

Thus the data "0" is written to the address "2" of the memory 20.

Thereafter, the zero-run counter 13 sends the count data C "2" to the adder 16. The adder 16 adds 1 and 2 and sends the resultant data G "3" to the selector 18. The selector 18 selects the data G "3" corresponding to the storage/select signal D "1" and sends the data G "3" to the selector 19 and the adder 12. The selector 19 sends the data J "3" to the memory 20 corresponding to the select signal RW "0". Thus, the data "0" is written to the address "3" of the memory 20.

Since the zero-run counter 13 has counted up for the value corresponding to the value of the RUN, the zero-run counter 13 outputs the storage signal D "0", causing the data storage portions 14 and 15 not to store data. Thus, the data storage portions 14 and 15 output the data E "3" and the data F "4", respectively. The data E "3" and the data F "4" are sent to the selectors 17 and 18, respectively. The selectors 17 and 18 send the data H "3" to the memory 20 and the data I "4" to the selector 19 and the adder 12 corresponding to the storage/select signal D "0", respectively. The selector 19 sends the data J "4" to the memory 20 corresponding to the select signal RW "0". The adder 12 adds 4 and 1 (CY) and sends the resultant data A "5" to the adder 11. Thus, the data "3" is written to the address "4" of the memory 20.

Thereafter, the RUN/LEVEL=1/1 set is input. Likewise, the data "1" is written to the address "6" of the memory 20. The adder 12 sends the resultant data A "7" to the adder 11. The zero-run counter 13 counts up from "1", "2", . . . to "57" corresponding to the EOB that has been input at last and outputs the count data C. In addition, the zero-run counter 13 outputs the storage signal D "1". Thus, the LEVEL data and the data B are stored. Consequently, the previous data "1" and "6" are output as the data E and F, respectively. The data E "1" is sent to the selector 17. The selector 17 selects the data "0" corresponding to the storage/select signal "1" and sends the data "0" to the memory 20. On the other hand, the selector 17 sends the data F "6" to the selector 18 and the adder 16. The adder 16 adds 1 and 6 of the data C "1" and the data F "6" and sends the resultant data G "7" to the selector 18. The selector 18 selects the data G "7" corresponding to the storage/select signal "1" and sends the data G "7" as the data I to the selector 19 and the adder 12. The selector 19 sends the data I "7" to the memory 20 corresponding to the signal RW "0" and writes the data "0" to the address "7" of the memory 20. Thus, the selector 19 writes the data "0" to the address "0" to "63". Consequently, as shown in Table 1, 64 data are stored in the memory 20. The contents of the data storage portions 14 and 15, the adders 11, 12, and 16, and the zero-run counter 13 are cleared.

TABLE 1

| ADDRESS (DECIMAL NOTATION) | DATA (DECIMAL NOTATION) |
| --- | --- |
| 1 | 5 |
| 2 | 0 |
| 3 | 0 |
| 4 | 3 |
| 5 | 0 |
| 6 | 1 |
| 7 | 0 |
| 8 | 0 |
| 9 | 0 |
| 10 | 0 |
| 11 | 0 |
| . | . |
| . | . |
| . | . |
| 59 | 0 |
| 60 | 0 |
| 61 | 0 |
| 62 | 0 |
| 63 | 0 |

By repeating the same operations, the zero-run developing process is performed. The data sent to the memory 20 is successively read by a zigzag scanning method or an alternate scanning method. The read data is sent to the dequantizing circuit.

Figure 2:
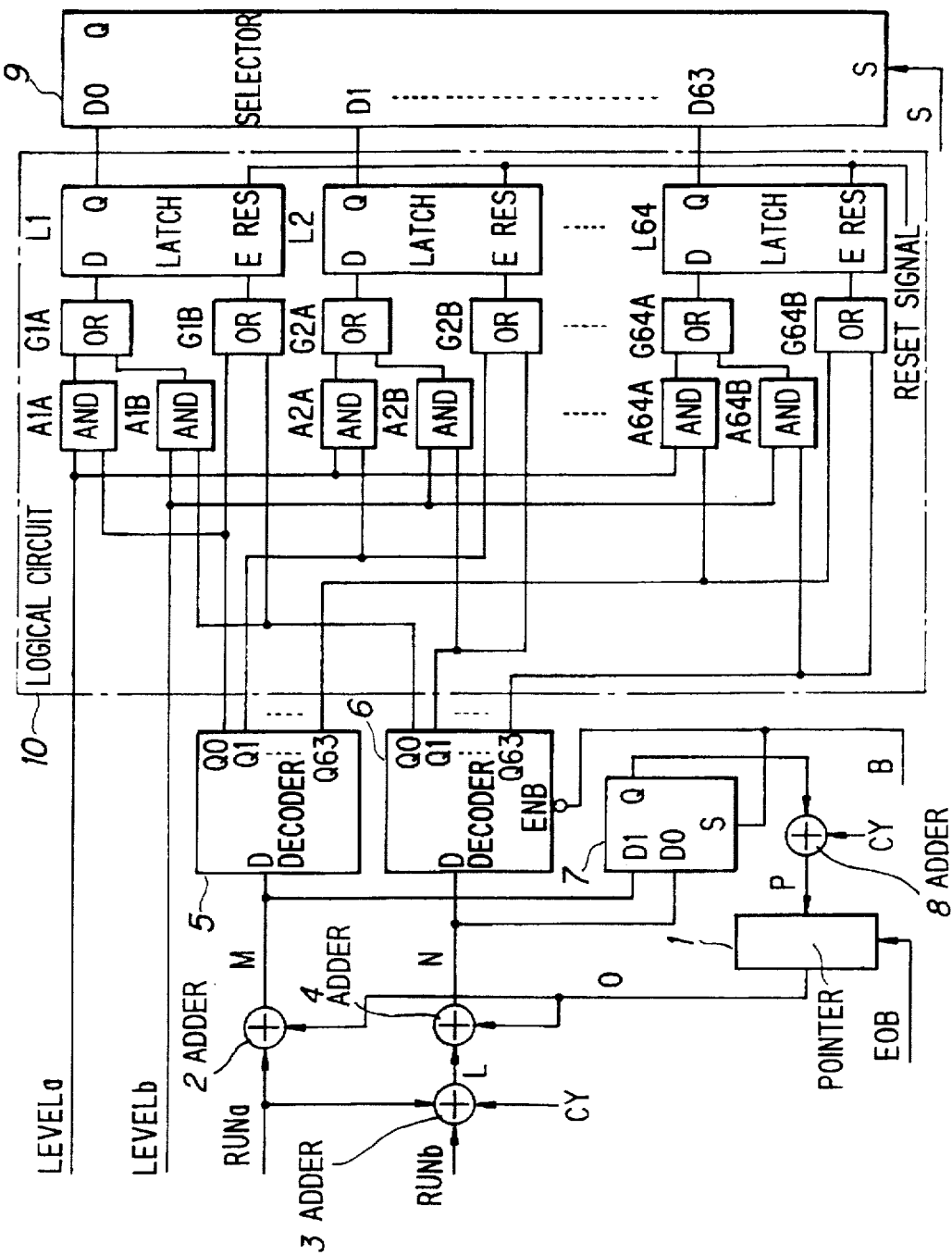
FIG. 2 is a block diagram showing a zero-run developing circuit in a preferred embodiment of the present invention.

FIG. 2 is a block diagram showing a zero-run developing circuit in the preferred embodiment of the present invention. The zero-run developing circuit according to the embodiment comprises a pointer 1, an adder 2, an adder 2, an adder 3, an adder 4, a decoder 5, a decoder 6, a selector 7, an adder 8, a logical circuit 10, and a selector 9. When an EOB is detected, the pointer 1 outputs data "0" as data 0. Otherwise, the pointer 1 outputs output data P of the adder 8. The adder 2 adds the data 0 and an RUNa and outputs resultant data M. The adder 3 adds the RUNa, an RUNb, and 1 (CY) and outputs resultant data L. The adder 4 adds the data 0 and data L and outputs data N. The decoder 5 inputs the data M. The decoder 6 inputs the data N. When the data N does not contain the RUNb, the decoder 6 is disabled. The selector 7 selects the data M or N and outputs data Q. The adder 8 adds the data Q and 1 (CY). The logical circuit 10 comprises AND gates A1A to A64A and A1B to A64B, OR gates G1A to G64A and G1B to G64B, and 64 latches L1 to L64.

Each of the decoders 5 and 6 has an input terminal D and 64 output terminals Q0 to Q63. Each of the decoders 5 and 6 outputs "1" to an output terminal corresponding to an input data value supplied to the input terminal and outputs "0" to the other output terminals.

The suffix a of RUNa/LEVELa represents odd numbered sets (the first, third, fifth, and so forth) to be processed in parallel. The suffix b of RUNb/LEVELb represents even numbered sets (the second, fourth, sixth and so forth) to be processed in parallel.

Next, as with the conventional circuit, one block is composed of 64 pixel data (8 (rows)×8 (columns)). With reference to FIG. 2, the operation of the zero-run developing circuit according to the embodiment will be described. The selector 7 receives a select signal B "0" or "1" corresponding to whether or not the RUNb is present.

When the select signal S is "1", the selector 7 selects a terminal D1. When the select signal S is "0", the selector 7 selects a terminal D0. When the input data of each of the decoders 5 and 6 is "0", the output data of the terminal Q0 of each of the decoders 5 and 6 is "1" and the output data of the other terminals Q1 to Q63 is "0". When the select signal S is "0", the selector 9 selects D0. When the select signal S is "1", the selector 9 selects D1. When the select signal S is "63", the selector 9 selects D63. Whenever the selector 9 outputs data for one block, each of the latches L1 to L63 is reset.

As with the conventional circuit, assume that first to fourth RUN/LEVEL sets (0/100, 0/5, 2/3, 1/1, and an EOB) are input. In other words, a RUNa/LENGTHa set represents the first RUN/LENGTH set and the third RUN/LENGTH set. A RUNb/LENGTHb set represents the second RUN/LENGTH and the fourth RUN/LENGTH set.

The first RUN/LEVEL set (0/100) as the RUNa/LENGTHa set and the second RUN/LEVEL set (0/5) as the RUNb/LENGTHb are input. The pointer 1 outputs the data 0 "0" and sends it to the adders 2 and 4. The RUNa=0 of the first set is sent to the adders 2 and 3. The adder 2 adds 0 and 0 and sends data M "0" to the decoder 5. Likewise, the RUNb=0 of the second set is sent to the adder 3. The adder 3 adds 0, 0 (the RUN data of the first set), and 1 (CY) and sends data L "1" to the adder 4. The adder 4 adds 1 and 0 and sends data N "1" to the decoder 6. The decoder 5 outputs "1" to the terminal Q0 and "0" to the terminals Q1 to Q63 corresponding to the data M "0". The decoder 6 sends "1" to the terminal Q1 and "0" to the terminals Q0 and Q2 to Q63 corresponding to the data N "1". Thus, the LEVELa= 100 of the first set is latched by the latch L1 and then sent to the terminal D0 of the selector 9. The LEVELb=5 of the second set is latched by the latch L2 and then sent to the terminal D1 of the selector 9.

The resultant data M "0" and N "1" are also sent to the selector 7. The selector 7 selects the output data N "1" of the adder 4 and sends it to the adder 8. The adder 8 adds 1 and 1 (CY) and sends resultant data P "2" to the pointer 1.

The third RUN/LEVEL set (2/3) and the fourth RUN/LEVEL set (1/1) are input as the RUNa/LEVELa set and the RUNb/LEVELb, respectively. The pointer 1 outputs the data 0 "2" and sends it to the adders 2 and 4. The RUNa=2 of the third set is sent to the adders 2 and 3. The adder 2 adds 2 and 2 and sends resultant data M "4" to the decoder 5. In addition, the RUNb=1 of the fourth set is sent to the adder 3. The adder 3 adds 1, 2 (RUN data of the third set), and 1 (CY) and sends resultant data L "4" to the adder 4. The adder 4 adds 4 and 2 and sends resultant data N "6" to the decoder 6.

Thereafter, the decoder 5 outputs "1" to the output terminal Q4 and "0" to the terminals Q1 to Q3 and Q5 to Q63 corresponding to the data M "4". On the other hand, the decoder 6 outputs "1" to the output terminal Q6 and "0" to the terminals Q0 to Q5 and Q7 to Q63 corresponding to the data N "6".

The logical circuit 10 performs logical operations corresponding to the output value "1" of the output terminals Q4 and Q6 of the decoders 5 and 6 and causes the latches L5 and L7 corresponding to the output data thereof to latch LEVEL "3" of the third set and the LEVEL "1" of the fourth set, respectively. The LEVEL "3" and the LEVEL "1" are sent to the terminals D4 and D6 of the selector 9, respectively.

The resultant data M "4" and N "6" are sent to the selector 7. The selector 7 selects the output data N "6" of the adder 4 and sends it to the adder 8. The adder 8 adds 6 and 1 (CY) and sends the resultant data P "7" to the pointer 1.

Thereafter, an EOB is input. 64 output data of the latches L1 to L64 of the logical circuit 10 accord with data of one block. Thus, when an EOB is detected, the data is read from the selector 9 corresponding to the zigzag scanning method or the alternate scanning method.

When the number of RUN/LEVEL sets is odd, the last set is the RUNa/LEVELa set rather than the RUNb/LEVELb. The select signal B is set to 1. The decoder 6 is disabled. In addition, the terminal D0 of the selector 7 is fixedly selected.

By repeating the above-described operations, the zero-run developing process is performed.

FIG. 3 shows the latches L1 to L64 for latching the first to fourth RUN/LEVEL sets (0/100, 0/5, 2/3 and 1/1). As apparent therein, there is no zero preceding "100" for 0/100, so that "100" is latched in the latch L1 to be stored at the address of "0" in the memory, and there is no zero preceding "5" for 0/5, so that "5" is latched in the latch L2 to be stored at the address of "1" in the memory. On the other hand, "3" is latched in the latch L5 to be stored at the address of "4" in the memory, because there are two zeros preceding "3" for 2/3, and "1" is latched in the latch L7 to be stored at the address of "6" in the memory, because there is one zero preceding "1" for 1/1.

In the preferred embodiment, RUN/LEVEL sets are divided into a and b groups to carry out the zero-run developing process for each two RUN/LEVEL sets. However, RUN/LEVEL sets may be divided into three or more groups to carry out the zero-run developing process for each three or more RUN/LEVEL sets.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention. For example, in the above-described embodiment, the number of RUN/LEVEL sets processed in parallel is two. However, the number of RUN/LEVEL sets processed in parallel may be three or more. The logical circuit may be composed of EX-OR circuits, shift registers, and so forth instead of AND/OR gates and latches.

What is claimed is:

1. A circuit for zero-run developing RUN/LEVEL sets, comprising:

latch means for latching the levels of the predetermined number of the non-zero data;

first write position generating means for generating a first latch position of said latch means at which the first non-zero data is written corresponding to a first run length signal; and second write position generating means for generating a second latch position of said latch means at which the second non-zero data is written corresponding to the first run-length signal and a second run-length signal.

2. A circuit for zero-run developing RUN/LEVEL sets as in claim 1, wherein said second write generating means generates said second latch position contemporaneously with said generation of said first latch position by said first write position generating means.

3. A circuit for zero-run developing RUN/LEVEL sets as in claim 1, wherein said second write generating means and said first write generating means operate in parallel.

4. A circuit for zero-run developing RUN/LEVEL sets comprising:

a latch which latches the levels of a predetermined number of non-zero data;

a pointer outputting a first value when a block end code signal representing end data of the block is detected and outputting data in a predetermined sequence when the block end code signal is not detected;

a first adder adding an output value of said pointer and a first run of a first run-length signal and outputting first addition data;

a first decoder outputting first latch designating data for designating a first latch position corresponding to the first addition data;

a second adder adding the first run, the second run of a second run-length signal, and a carry signal and outputting second addition data;

a third adder adding the output value of said pointer and the second addition data and outputting third addition data; and a second decoder outputting second latch designating data for designating a second latch position corresponding to the third addition data.

5. A circuit for zero-run developing RUN/LEVEL sets, comprising:

a predetermined number of latches for latching LEVEL data of said RUN/LEVEL sets, each latch having one of serial addresses; and two or more means for generating two or more addresses of said serial addresses, each means generating said one of said serial addresses by counting a number of said RUN/LEVEL sets, and a number of zeros of a RUN/LEVEL set, for which an address is presently to be generated, said number of said RUN/LEVEL sets including RUN/LEVEL sets already latched in said latches and said RUN/LEVEL set to be latched in one of said latches.

6. A method for zero-run developing RUN/LEVEL sets, comprising the steps of:

generating an array position of the first non-zero data corresponding to a first run length signal; and generating an array position of the second non-zero data corresponding to the first run-length signal and a second run-length signal.

7. A method for zero-run developing RUN/LEVEL sets, comprising the steps of:

providing first and second means for generating first and second sets of addresses by receiving first and second sets of RUN data of said RUN/LEVEL sets;

generating said first and second sets of addresses by counting a number of said first and second sets of said RUN data and a number of zeros determined by RUN data;

providing latches corresponding in number to said first and second sets of addresses; and latching LEVEL data in said latches in accordance with said first and second sets of addresses generated.

* * * * *